United States Patent [19]

Mizukami et al.

[11] Patent Number: 4,939,691

[45] Date of Patent: Jul. 3, 1990

[54] STATIC RANDOM ACCESS MEMORY

[75] Inventors: Shigeto Mizukami; Makoto Segawa, both of Yokohama, Japan

[73] Assignee: Kabushiki Kaisha Toshiba, Kawasaki, Japan

[21] Appl. No.: 260,427

[22] Filed: Oct. 20, 1988

[30] Foreign Application Priority Data

Oct. 31, 1987 [JP] Japan .................. 62-276262

[51] Int. Cl.$^5$ ............................. G11C 13/00
[52] U.S. Cl. .................. 365/189.01; 365/189.05; 365/203
[58] Field of Search ............ 365/189.01, 189.04, 365/189.05, 189.07, 203

[56] References Cited

U.S. PATENT DOCUMENTS 4,608,670  8/1986  Duvvury .................. 365/203

Primary Examiner—Terrell W. Fears
Attorney, Agent, or Firm—Finnegan, Henderson, Farabow, Garrett, and Dunner

[57] ABSTRACT

In a static random access memory, when data is written into said plurality of memory cells, a write enable signal is set at a low level, and after the data write is completed, the write enable signal is set at a high level. In response to a level change of the write enable signal from a low level to a high level, a pulse generator generates a pulse signal in "1" level and with a given pulse width. In response to this pulse signal, a first MOS transistor is turned on to short paired bit lines. This pulse signal turns on second and third MOS transistors. Then, the potentials on the paired bit lines are pulled up to a power source potential. As a result, of the two bit lines, the bit line which has been set at a low potential immediately after data is written, is charged. A pulse extension/inverting circuit extends the pulse width of the pulse signal generated by a pulse generator by a given time period, and inverts a logical state of the pulse signal. During a period that the first MOS transistor shorts the bit lines to place the equal potentials on the bit lines, the pulse signal φWRD output from the pulse extension/inverting circuit is kept in "0" level. During this period, therefore, the output data of two AND gates is "0" level irrespective of the sensed data from a read circuit and the supply of the sensed data from the read circuit to a data output circuit is stopped.

17 Claims, 6 Drawing Sheets

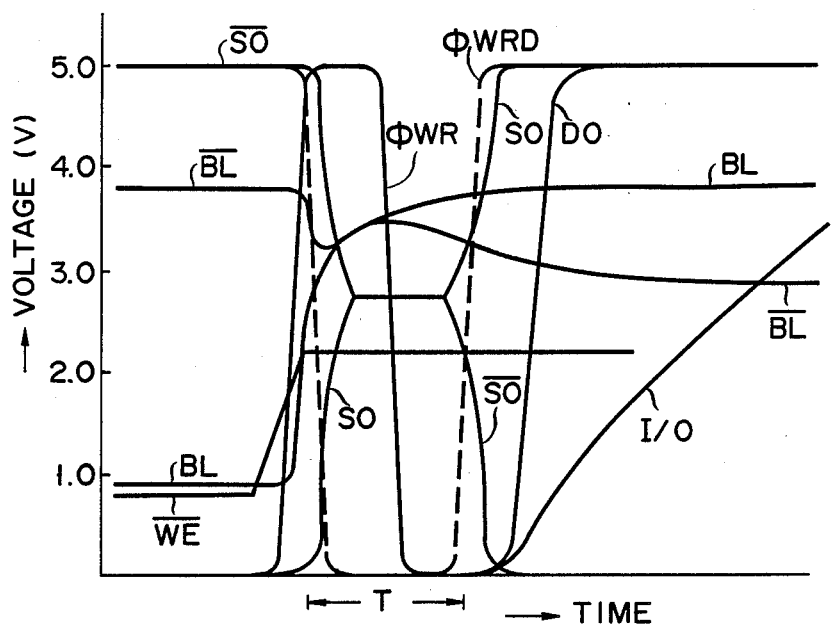
F I G. 3
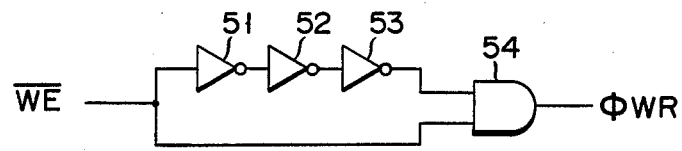
F I G. 4
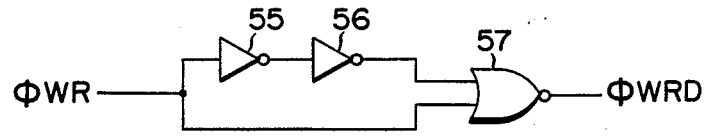
F I G. 5

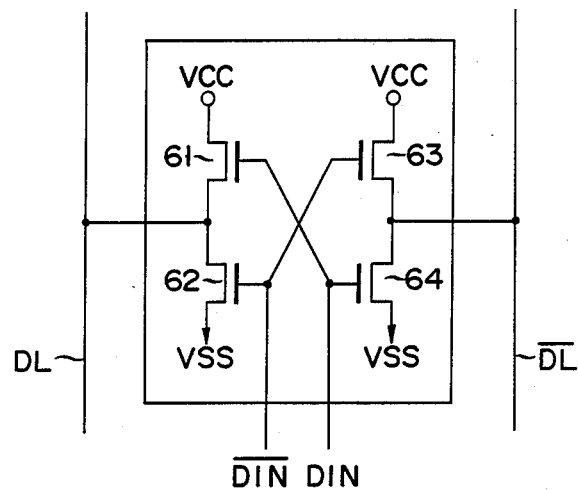
F I G. 6
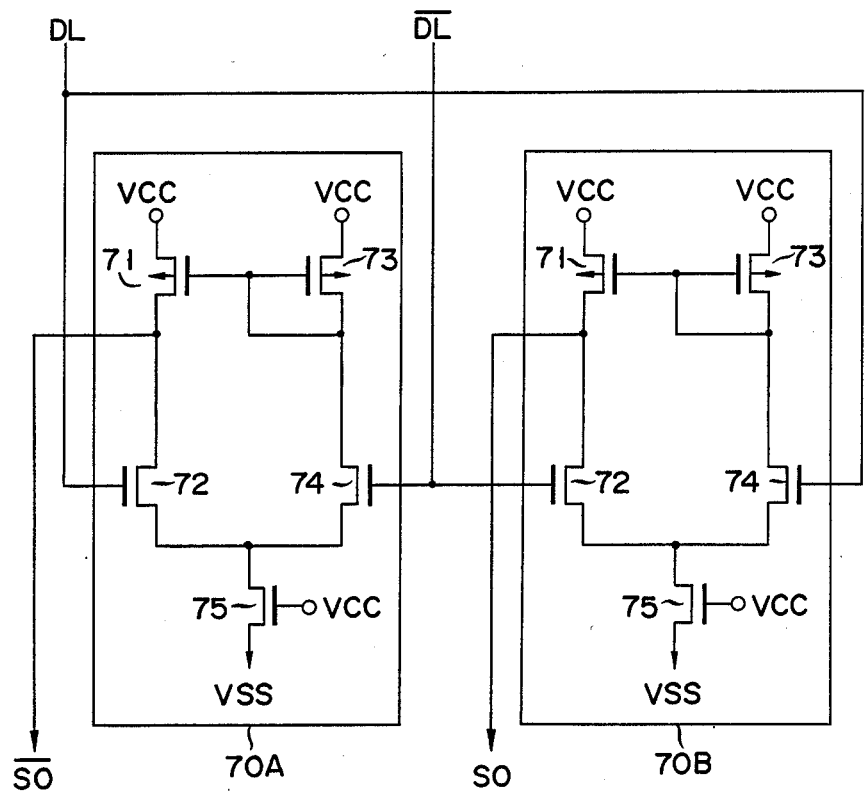
F I G. 7

STATIC RANDOM ACCESS MEMORY

BACKGROUND OF THE INVENTION

1. Field of the Invention

This invention relates to a static random access memory using static memory cells.

2. Description of the Related Art

In a static random access memory (SRAM), a plurality of static memory cells are connected in parallel between paired bit lines. These memory cells are selected responsive to the signals on word lines associated with the memory cells, respectively. In the SRAM, a minimum time required for reading out data from these memory cells varies depending on the potential on the bit lines immediately before the data is read out. In a practical use of the memory, there is a situation that data is written into a memory cell, and another data that is the inverted data previously written is read out from another memory cell connecting to the same bit line pair as that coupled with the data written memory cell. There is another situation that a data read mode has continued, and data is read out from a memory cell, and another data that is the inverted data previously read out, is read out from another memory cell. The read time in the former situation must be longer than that in the latter situation.

FIG. 1 shows a circuit diagram showing an arrangement around the memory cells in a conventional SRAM. A plurality memory cells MCn (n=any of positive integers except 0) are connected in parallel between paired bit lines BL and $\overline{BL}$. These memory cells may be E/R type static memory cells. This type of memory cell, for example, MC1, is made up of a flip-flop 15 for data storage, and a couple of MOS transistors 16 and 17 as transfer gates. The flip-flop 15 consists of two MOS transistors 11 and 12 cross connected at the gates and the drains as shown, and two load resistors 13 and 14. The transfer gate transistors 16 and 17 are turned on and off in response to the signal on word line WL1.

As shown, two MOS transistors 21 and 22 as loads are respectively connected between the bit lines BL and $\overline{BL}$ and the power source voltage Vcc. The bit lines BL and $\overline{BL}$ are respectively connected to data lines DL and $\overline{DL}$, through MOS transistors 23 and 24 for column decoding. The gates of these column decoding transistors 23 and 24 are applied with a decode signal CD from a column decoder (not shown). These transistors are turned on and off under control of the decode signal CD. Two load MOS transistors 25 and 26 are respectively connected between the data lines DL and $\overline{DL}$, and the power source voltage Vcc.

The data lines DL and $\overline{DL}$ are coupled with write circuit 31 and read circuit 32. The write circuit 31 responds to complementary input data DIN and $\overline{DIN}$, and outputs complementary write data for transfer to data lines DL and $\overline{DL}$. When data is read out of the memory cells, the read circuit 32 amplifiers a potential difference between paired data lines DL and $\overline{DL}$, and senses and outputs complementary data SO and $\overline{SO}$.

In one memory cell MC1, for example, a storage state of data "1" places the cell circuit in such a state that transistor 11 is off, transistor 12 is on, node N1 connecting to resistor 13 is "1", and node N2 connecting to resistor 14 is "0". A data "0" storage state places the cell circuit in the reversed state.

To write data "0" to the memory cell MC1 in the SRAM, the input data DIN to write circuit 31 is set at "0", and data $\overline{DIN}$ is at "1". The result is that the write data of "0" is applied from write circuit 31 to data line DL, and write data of "1" to data line $\overline{DL}$. Both the write data are transferred to paired bit lines BL and $\overline{BL}$, through column decoding transistors 23 and 24. As a result, the node N1 in memory cell MC1 is forcibly pulled to "0" level. In turn, the transistor 12 cannot maintain its on state, and the potential at node N2 rises, and transistor 11 is turned on, and node N1 is set at "0". In this way, data "0" is written into memory cell MC1. Let us consider now that word line WL2 is selected immediately after this data write operation, and data "1" is read out from memory cell MC2. To read out data "1" from memory cell MC2 immediately after data "0" is written into memory cell MC1, the potential on bit line BL must be pulsed from "0" to "1", and the potential on bit line $\overline{BL}$ must be pulsed from "1" to "0". To rise the bit line BL potential from "0" to "1", it is necessary to charge the bit line BL by power source Vcc through load transistors 21 and 25. However, there is a limit in increasing the size of each transistor 21 and 25, and a subsequent limit in the conductance of the transistor. That is, a "0" level potential on the bit line BL and data line DL is determined by the size of transistors 21 and 25 and if the size of these transistors is increased there occurs an increase in their "0" level potential. For the same reason as set forth above it is not possible either to increase the size of transistors 22 and 26. This fact indicates that the bit line BL charge is not quick. At the start of data reading operation in read circuit 32, bit line BL rises from "0" to "1", and the potential on bit line $\overline{BL}$ falls "1" to "0". Subsequently, the potentials on either bit line will be inverted. From this level inverted point on, actual data read operation is allowed. To rise the potential on the bit line BL, it must be charged by load transistors 21 and 25 for a given time period. For this reason, when immediately after data is written into a memory cell, the data that is the inverted data previously written is read out from another memory cell connecting between the same paired bit lines, the read time of that data is longer time than that of other data.

SUMMARY OF THE INVENTION

Accordingly, an object of this invention is to provide a static random access memory in which when immediately after data is written into a memory cell, the data that is the inverted data previously written is read out from another memory cell connecting between the same paired bit lines, the read time of that data is reduced.

According to this invention, there is provided a static random access memory comprising paired bit lines, a plurality of static memory cells connected in parallel between said paired bit lines, a write means coupled with said bit lines and for supplying write data to said bit lines, a read means coupled with said bit lines and for sensing data on the basis of the potentials on said bit lines, a data output means coupled with said read means and for outputting the data sensed by said read means, a control signal terminal supplied with a write control signal, when data is written into said plurality of memory cells, said write control signal being set at a first level, and after the data write is completed, said write control signal being set at a second level, a pulse generating means for generating a pulse signal with a given pulse width in response to a level change in said write control signal from the first level to the second level, a pulse extension means for extending the pulse width of the pulse signal generated by said pulse generating means, a first switching element connected between said two bit lines, said first switching element being turned on and off by said pulse signal, second and third switching elements respectively connected between said bit lines and applied points of power source potentials, said second and third switching elements being turned on and off by said pulse signal, and a gate circuit connected between said read means and said data output means and for controlling the supply of sensed data from said read means to said data output means according to the pulse signal extended by said pulse extension means.

BRIEF DESCRIPTION OF THE DRAWINGS

FIG. 3 shows a graph showing variations of the voltages at key portions of the FIG. 2 circuit;

FIG. 4 shows a circuit diagram showing a pulse generator used in the FIG. 2 circuit;

FIG. 5 shows a circuit diagram showing a delay/inverting circuit used in the FIG. 2 circuit;

FIG. 6 shows a circuit diagram showing a write circuit used in the FIG. 2 circuit;

FIG. 7 shows a circuit diagram showing a read circuit used in the FIG. 2 circuit;

DETAILED DESCRIPTION OF THE PREFERRED EMBODIMENTS

This invention will be described by using some specific embodiments.

Figure 1:
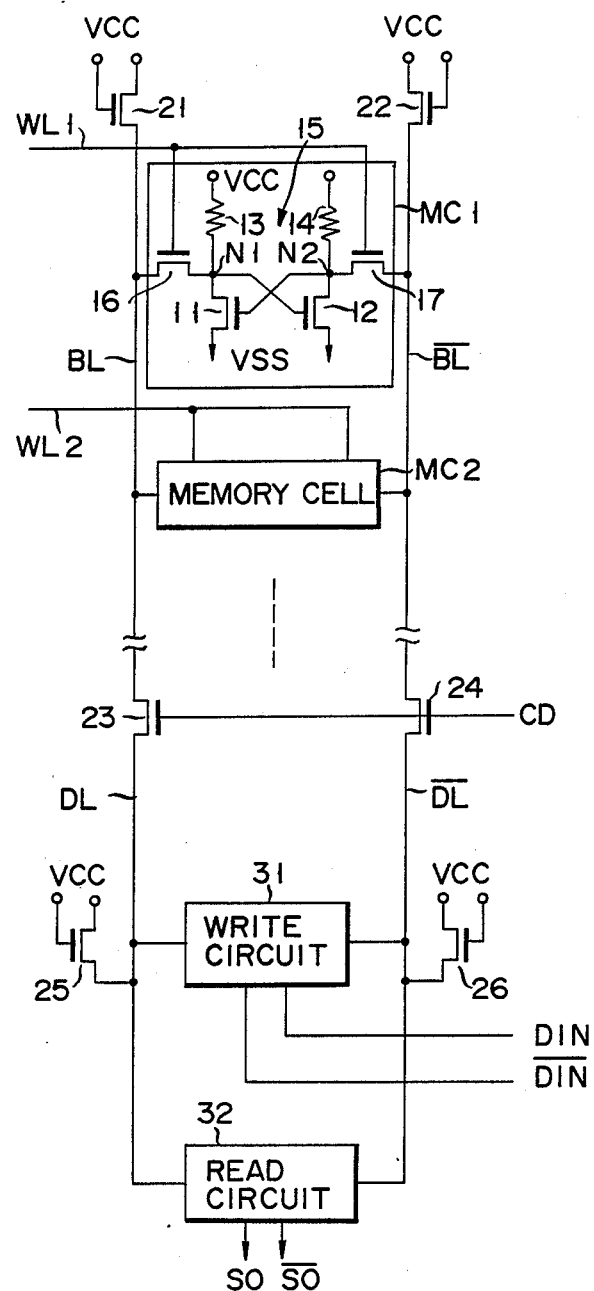
FIG. 1 shows a circuit diagram showing an arrangement around the memory cells in a conventional SRAM.
Figure 2:
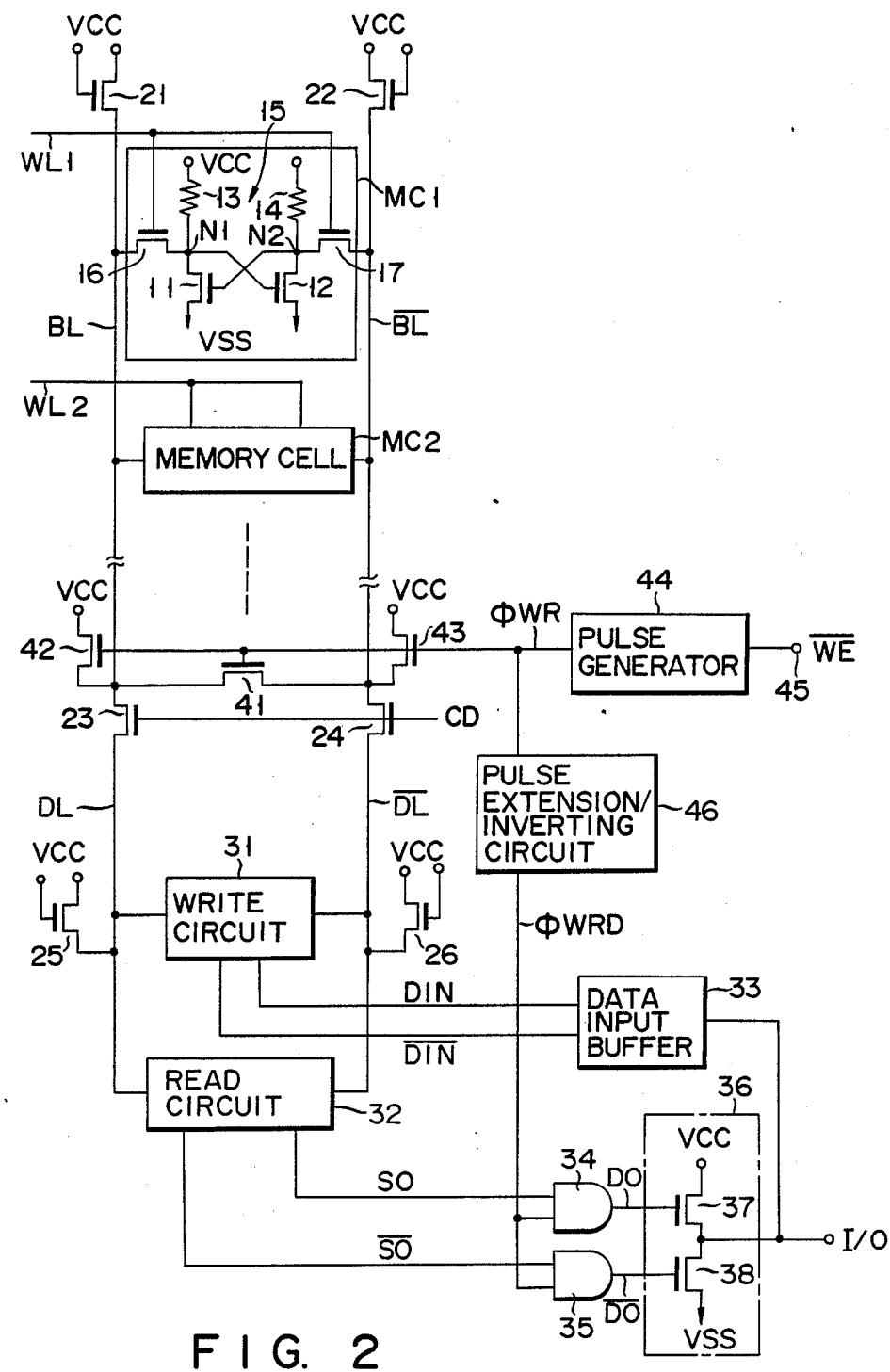
FIG. 2 shows a circuit diagram showing an arrangement of a static random access memory according to an embodiment of this invention.

FIG. 2 shows a circuit diagram showing an arrangement according to an embodiment of this invention. A plurality memory cells MCn (n =any of positive integers except 0) are connected in parallel between paired bit lines BL and $\overline{BL}$. These memory cells may be ordinary E/R type static memory cells, as in the conventional SRAM. Each memory cell, for example, MC1, is made up of a flip-flop 15 including MOS transistors 11 and 12, and a couple of MOS transistors 16 and 17 as transfer gates. The flip-flop 15 consists of two MOS transistors 11 and 12 cross connected at the gates and the drains as shown, and two load resistors 13 and 14. The transfer gate transistors 16 and 17 are turned on and off in response to the signal on word line WL1.

As shown, two MOS transistors 21 and 22 as loads are respectively connected between the bit lines BL and $\overline{BL}$ and the power source voltage Vcc. The gates of both the transistors 21 and 22 are connected to the Vcc voltage applied points, respectively, and these transistors are always placed in an on-state. The bit lines BL and $\overline{BL}$ are respectively connected to data lines DL and $\overline{DL}$, through MOS transistors 23 and 24 for column switching. The column switching transistors 23 and 24 are applied with a decode signal CD from a column decoder (not shown). These transistors are turned on and off under control of the decode signal CD. Two load MOS transistors 25 and 26 are respectively connected between the data lines DL and $\overline{DL}$, and the power source voltage Vcc. With such a connection, both the load transistors are always in an on-state. The data lines DL and $\overline{DL}$ are coupled with write circuit 31 and read circuit 32. The write circuit 31 receives complementary input data DIN and $\overline{DIN}$ derived from data input buffer 33. The complementary data SO and $\overline{SO}$ sensed by read circuit 32 are respectively input to the first input terminals of AND gates 34 and 35 with two inputs.

Data output buffer 36 substantially consists of a couple of MOS transistors 37 and 38 connected in series between the Vcc (power source voltage) and Vss (earth voltage) applied points. The gates of these transistors are coupled for reception with the output signal of AND gates 34 and 35. The output of data output buffer 36 and the input of data input buffer 33 are both connected to an I/0 (input/output) terminal.

MOS transistor 41 for short-circuiting is inserted between paired bit lines BL and $\overline{BL}$. MOS transistors 42 and 43 are respectively inserted between the bit lines BL and $\overline{BL}$ and the Vcc applied points, as shown. These three transistors 41 to 43 are connected together at the gates. Pulse generator 44 is connected at the input to an input terminal 45 for receiving a write enable signal $\overline{WE}$. The signal $\overline{WE}$ is placed in logical "0" when data is written into each memory cell, and is placed in logical "1" when data is read out from the memory cell. Pulse generator 44 generates "1" pulse signal $\phi WR$ with a given pulse width in response to a transient variation of write enable signal $\overline{WE}$ when it is pulsed from "0" to "1". The pulse signal $\phi WR$ from pulse generator 44 is applied to the gates of the transistors 41 to 43, and further to pulse extension/inverting circuit 46. This circuit 46 produces "0" pulse signal $\phi WRD$ whose pulse width is longer than that of the pulse $\phi WR$ from the pulse generator 44. The generated pulse signal $\phi WRD$ is applied to the second input terminals of AND gates 34 and 35.

In the above circuit arrangement, the MOS transistors are all of the enhancement type.

The operation of the SRAM thus arranged will be described. The operation of the memory to be described by way of example is for the following case. All of the memory cells store data "1". Word line WL1 is first driven. Data "0" is written into a memory cell MC1 selected by word line WL1. Then, another word line WL2 is driven. Data "1" is read out from memory cell MC2 selected by this word line WL2.

FIG. 3 shows variations of voltages at the key portions in the FIG. 2 circuit in the above operation that after data is written into memory cell MC1, data is read out from memory cell MC2.

When data "0" is written into one memory cell MC1, write enable signal $\overline{WE}$ has been set at "0". Under this condition, when data "0" is input to the I/O terminal, and transferred to data input buffer 33, data input buffer 33 produces "0" data DIN and "1" data $\overline{DIN}$, which in turn are input to write circuit 31. In response to these data, write circuit 31 produces write data "0" onto data line DL and write data "1" onto another data line $\overline{DL}$. Both the write data are transferred to paired bit lines BL and $\overline{BL}$, through two MOS transistors 23 and 24 for column switching, which have been placed in an on-state by decode signal CD. As a result, the node N1 in memory cell MC1 is forcibly pulled to "0" level. Under this condition, the MOS transistor 12 in memory cell MC1 cannot maintain its on-state, the potential at node N1 rises to turn on transistor 11. Finally, node N1 is set at "0" level, and data "0" is stored into memory cell MC1.

Next, to read out data from memory cell MC2, write enable signal $\overline{WE}$ changes its level from "0" to "1". Word line WL2 is driven, to select memory cell MC2. When write enable signal $\overline{WE}$ is changed in level from "0" to "1", pulse generator 44 responds to the level change and produces "1" pulse signal $\phi WR$, as shown in FIG. 3. When pulse signal $\phi WR$ rises to "1", MOS transistors 41 to 43 are turned on. On-state of transistor 41 shorts the paired bit lines BL and $\overline{BL}$. The different potentials on the bit lines as were so set when data "0" is written into memory cell MC1, progressively change toward the same potential. At the same time, transistors 42 and 43 are turned on, to pull up the potentials on bit lines BL and $\overline{BL}$ to the voltage Vcc. With this progression, the potentials of the bit lines are rapidly set at potential near "1" level (3 to 3.5 V for Vcc=5 V).

Subsequently, the bit line BL potential is changed from the potential when these lines are shorted, to "1" level, and the other bit line $\overline{BL}$ from the same potential toward "0" level, and finally data "1" is read out from memory cell MC2. Thus, when after data "0" is written into one memory cell, the inverted data is read out from another memory cell, the bit line are at the same potential near the Vcc. When comparing with the conventional case that the lower potential bit line are charged from the potential near "0" level, the memory of this embodiment may reduce the delay of the read time of reading "1" data.

During a period of time that MOS transistor 41 shorts the pair of bit lines BL and $\overline{BL}$, the potentials on these bit lines are kept equal, the input potentials of read circuit 32 are equal. Therefore, there is a danger that the data output from data output buffer 36 may be instable. To be more specific, at this time, the sensed data SO and $\overline{SO}$ in complementary level derived from read circuit 32 are at the intermediate potential between Vcc and Vss. If the medium potential is directly applied to the gates of transistors 37 and 38 in output buffer 36, these transistors are simultaneously turned on. Accordingly, there is a danger that the output potential of data output buffer 36 may be at the medium potential. If so, DC current flows through the series source-drain path of output buffer 36 between the Vcc and Vss. It is noted here that in the memory of this embodiment, during a period (T in FIG. 3) from an instant that pulse signal $\phi WR$ rises to "1" till it falls to "0" and a given time period elapses, the output signal $\phi WRD$ of pulse extension/inverting circuit 46 is kept at "0". During this period, therefore, the output DO and $\overline{DO}$ of AND gates 34 and 35 are "0" irrespective of the levels of outputs SO and $\overline{SO}$ of read circuit 32. At this time, the transistors 37 and 38 in data output buffer 36 are both turned off, and hence the output potential of output buffer 36 never becomes the medium potential. The output $\phi WRD$ of pulse extension/inverting circuit 46 rises again after a given period of time from an instant that the output signal of pulse generator 44 falls to "0". This delay time of pulse extension/inverting circuit 46 is selected to be equal to the delay time in read circuit 32 that the potentials on data lines DL and $\overline{DL}$ are settled down on the basis of the data read out from memory cell MC2, then read circuit 32 is operated, and it produces the sensed data. Thus, since the SRAM of this embodiment is designed allowing for the delay of the read-out operation by read circuit 32, the output data of data output buffer 36 is stable.

FIG. 4 shows a specific configuration of the pulse generator 44. The pulse signal $\phi WR$ is generated in the following way. The write enable signal $\overline{WE}$ is input to the first stage of multi-stage inverters consisting of odd number of inverters, e.g. three inverters 51 to 53, and to the first input terminal of two-input AND gate 54. The output signal of the final stage of the multistage inverters is applied to the second input of the AND gate 54. Pulse signal $\phi WRD$ is derived from the output terminal of AND gate 54.

FIG. 5 shows a specific configuration of the pulse extension/inverting circuit 46. The pulse signal $\phi WRD$ is generated in the following way. The pulse signal $\phi WR$ from the pulse generator 44 is input to the first stage of multi-stage inverters consisting of even number of inverters, e.g. two inverters 55 and 56, and to the first input terminal of two-input NOR gate 57. The output signal of the final stage of the multi-stage inverters is applied to the second input of the NOR gate 57. Pulse signal $\phi WRD$ is derived from the output terminal of NOR gate 57.

FIG. 6 shows a specific configuration of the write circuit 31. Write circuit 31 is provided with two sets of paired N-channel MOS transistors 61 and 62, and 63 and 64. The source-drain paths of each pair of transistors are connected in series between the Vss and Vcc. The gates of transistors 61 and 64 are interconnected and coupled with data DIN, while the gates of the remaining ones are also interconnected, and coupled with data $\overline{DL}$. The connection point of transistors 61 and 62 is connected to data line DL and the connection point of transistors 63 and 64 to data line $\overline{DL}$.

With the write circuit 31 thus arranged, when data input buffer 33 produces "1" data DIN and "0" data $\overline{DIN}$, transistors 61 and 64 are turned on, while transistors 62 and 63 are turned off. Subsequently, "1" write data is output onto data line DL, while "0" write data onto data line $\overline{DL}$.

FIG. 7 shows a specific configuration of the read circuit 32. Read circuit 32 is made up of two current mirror amplifiers 70A and 70B. In each of the amplifiers 70A and 70B, P-channel MOS transistor 71 and N-channel MOS transistors 72 are provided, and the source-drain paths of them are connected in series between the Vcc and node N11. P-channel MOS transistor 73 and N-channel MOS transistors 74 are provided, and the source-drain paths of them are connected in series between the Vcc and node N11. One N-channel MOS transistor 75 is provided and its source-drain path is connected in series between the Vss and node N11. The gates of transistors 71 and 73 are interconnected, and further to the connection point of transistors 73 and 74. The gate of MOS transistor 75 is connected to the Vcc applied point. In the current mirror amplifier 70A, the gates of transistors 72 and 74 are respectively connected to data lines DL and $\overline{DL}$. In the current mirror amplifier 70B, the gates of transistors 72 and 74 are respectively connected to data lines $\overline{DL}$ and DL. Sensed data $\overline{SO}$ is derived from the connection point of two transistors 71 and 72 in amplifier 70A. Sensed data SO is derived from the connection point of two transistors 71 and 72 in amplifier 70B.

In the read circuit thus arranged, when data line DL is "1" and data line $\overline{DL}$ is "0", the transistor 72 is turned on and transistor 74 is turned off in current mirror amplifier 70A. The amplifier 70A produces "0" data as sensed data $\overline{SO}$. In the current mirror amplifier 70B, transistor 72 is turned off and transistor 74 is turned on in current mirror amplifier 70B. The amplifier 70B produces "1" data as sensed data SO.

Figure 8:
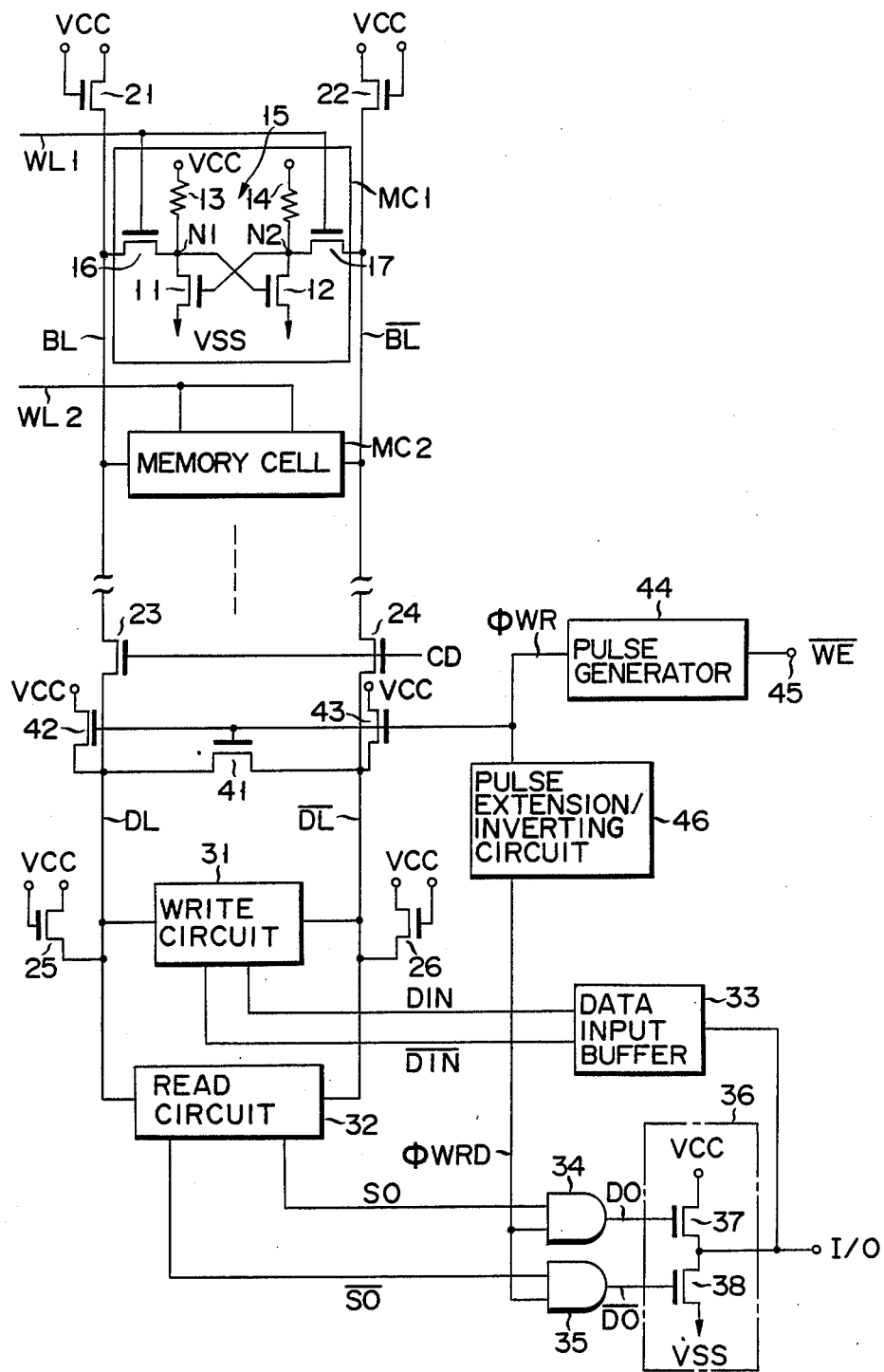
FIG. 8 shows a circuit diagram showing an arrangement of a static random access memory according to another embodiment of this invention.

FIG. 8 shows another embodiment of an SRAM according to this invention. In the FIG. 2 SRAM, as recalled, the source and drain of MOS transistor 41 are respectively connected to paired bit lines BL and $\overline{BL}$. The source-drain paths of other two transistors 42 and 43 are respectively connected bit lines BL and $\overline{BL}$ and the Vcc. In this embodiment, the source and drain of MOS transistor 41 are respectively connected to paired data lines DL and $\overline{DL}$. The source-drain paths of other two transistors 42 and 43 are respectively connected bit lines DL and $\overline{DL}$ and the Vcc. This embodiment may have the effects comparable with those of the FIG. 2 embodiment. The reason for this is that in a read mode, bit lines BL and $\overline{BL}$ are respectively connected data lines DL and $\overline{DL}$, through MOS transistors 42 and 43 for column switch, and therefore the potentials on data lines DL and $\overline{DL}$ are equal to those on bit lines BL and $\overline{BL}$.

Figure 9:
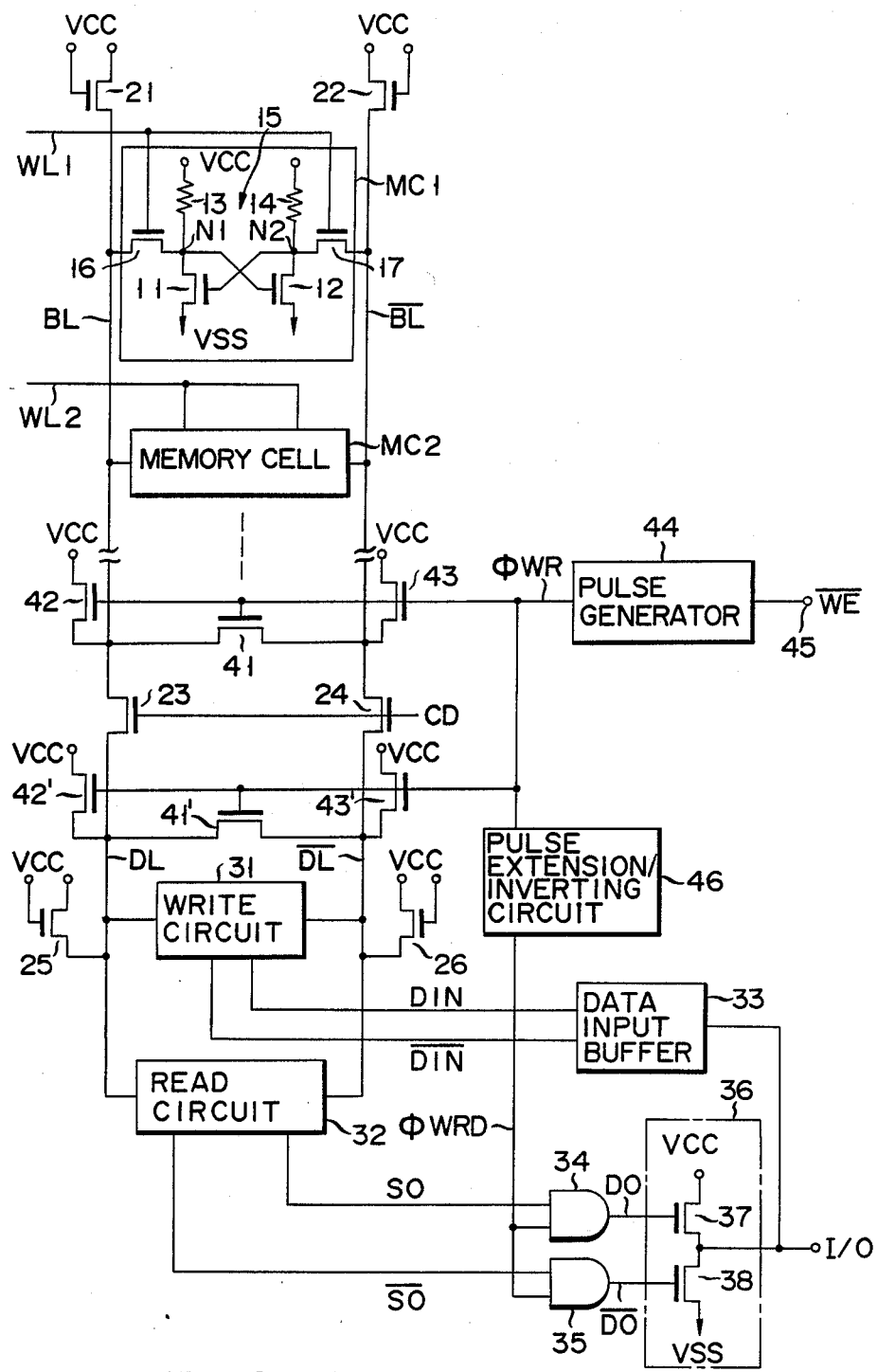
FIG. 9 shows a circuit diagram showing an arrangement of a static random access memory according to yet another embodiment of this invention.

FIG. 9 shows yet another embodiment of this invention. In the FIG. 9, bit lines BL and $\overline{BL}$ are coupled with a trio of MOS transistors 41 to 43. Data lines DL and $\overline{DL}$ are also coupled with a trio of MOS transistors 41' to 43', which are equivalent in characteristics to those 41 to 43. This arrangement may rapidly charge the "0" bit line up to "1" level.

As described above, the SRAM of this invention may reduce the read time when immediately after data is written, the inverted data is read out.

What is claimed is:

1. A static random access memory comprising:
    paired bit lines;
    a plurality of static memory cells connected in parallel between said paired bit lines;
    a write means coupled with said bit lines and for supplying write data to said bit lines;
    a read means coupled with said bit lines and for sensing data on the basis of the potentials on said bit lines;
    a data output means coupled with said read means and for outputting the data sensed by said read means;
    a control signal terminal supplied with a write control signal, when data is written into said plurality of memory cells, said write control signal being set at a first level, and after the data write is completed, said write control signal being set at a second level;
    a pulse generating means for generating a pulse signal with a given pulse width in response to a level change in said write control signal from the first level to the second level;
    a pulse extension means for extending the pulse width of the pulse signal generated by said pulse generating means;
    a first switching element connected between said bit lines, said first switching element being turned on and off by said pulse signal;
    second and third switching elements respectively connected between said bit lines and applied points of power source potentials, said second and third switching elements being turned on and off by said pulse signal; and
    a gate circuit connected between said read means and said data output means and for controlling the supply of sensed data from said read means to said data output means according to the pulse signal extended by said pulse extension means.

2. A static random access memory according to claim 1, in which said first switching element is connected between paired data lines through said paired bit lines and a switching element, and said second and third switching elements are respectively connected between said paired data lines and the applied points of power source potential.

3. A static random access memory according to claim 1, in which said first to third switching elements are MOS transistors.

4. A static random access memory according to claim 1, in which said control signal terminal is supplied with a write enable signal, when data is written into said plurality of memory cells, said write enable signal being set at a low level, and after the data write is completed, said write enable signal being set at a high level.

5. A static random access memory according to claim 1, in which said pulse generating means includes an odd number of inverting circuits connected in tandem, the first stage of said inverting circuits receiving the write control signal supplied to said control signal terminal and an AND gate supplied with the output signal from the final stage of said inverting circuits and the write control signal supplied to said control signal terminal.

6. A static random access memory according to claim 1, in which said pulse extension means includes an even number of inverting circuits connected in tandem, the first stage of said inverting circuits receiving the pulse signal from said pulse generating means, and a NOR gate supplied with the pulse signal from the final stage of said inverting circuits and said pulse generating means.

7. A static random access memory according to claim 1, in which said gate circuit includes two AND gates coupled for reception with the complementary data output from said read means and the pulse signal extended by said pulse extension means.

8. A static random access memory according to claim 1, in which said pulse extension means extends the pulse width of the pulse signal generated by said pulse generating means by a time period from an instant that data is read out from one of said plurality of memory cells till said read means operates to complementary data.

9. A static random access memory according to claim 1, in which said pulse extension means extends the pulse width of the pulse signal generated by said pulse generating means, and inverts a logical state of the extended pulse signal with respect to the pulse signal generated by said pulse generating means.

10. A static random access memory comprising:
    paired bit lines;
    a plurality of static memory cells connected in parallel between said paired bit lines;
    paired data lines;
    first and second switching elements respectively connected between said paired bit lines and said data lines, said first and second switching elements being turned on and off by a column decode signal;
    a write means coupled with said data lines and for supplying write data to said data lines;
    a read means coupled with said data lines and for sensing data on the basis of the potentials on said data lines;
    a data output means coupled with said read means and for outputting the data sensed by said read means;

a control signal terminal supplied with a write control signal, when data is written into said plurality of memory cells, said write control signal being set at a first level, and after the data write is completed, said write control signal being set at a second level;

a pulse generating means for generating a pulse signal with a given pulse width in response to a level change in said write control signal from the first level to the second level;

a pulse extension means for extending the pulse width of the pulse signal generated by said pulse generating means;

a third switching element connected between said bit lines, said third switching element being turned on and off by said pulse signal generated by said pulse generating means;

fourth and fifth switching elements respectively connected between said bit lines and applied points of power source potentials, said fourth and fifth switching elements being turned on and off by said pulse signal generated by said pulse generating means; and a sixth switching element connected between said paired data lines, said sixth switching element being turned on and off by said pulse signal generated by said pulse generating means;

seventh and eighth switching elements respectively connected between said data lines and applied points of power source potentials, said seventh and eighth switching elements being turned on and off by said pulse signal generated by said pulse generating means; and a gate circuit connected between said read means and said data output means and for controlling the supply of sensed data from said read means to said data output means according to the pulse signal extended by said pulse extension means.

11. A static random access memory according to claim 10, in which said first to eighth switching elements are MOS transistors.

12. A static random access memory according to claim 10, in which said control signal terminal is supplied with a write enable signal, when data is written into said plurality of memory cells, said write enable signal being set at a low level, and after the data write is completed, said write enable signal being set at a high level.

13. A static random access memory according to claim 10, in which said pulse generating means includes an odd number of inverting circuits connected in tandem, the first stage of said inverting circuits receiving the write control signal supplied to said control signal terminal, and an AND gate supplied with the output signal from the final stage of said inverting circuits and the write control signal supplied to said control signal terminal.

14. A static random access memory according to claim 10, in which said pulse extension means includes an even number of inverting circuits connected in tandem, the first stage of said inverting circuits receiving the pulse signal from said pulse generating means, and a NOR gate supplied with the pulse signal from the final stage of said inverting circuits and said pulse generating means.

15. A static random access memory according to claim 10, in which said gate circuit includes two AND gates coupled for reception with the complementary data output from said read means and the pulse signal extended by said pulse extension means.

16. A static random access memory according to claim 10, in which said pulse extension means extends the pulse width of the pulse signal generated by said pulse generating means by a time period from an instant that data is read out from one of said plurality of memory cells till said read means operates to complementary data.

17. A static random access memory according to claim 10, in which said pulse extension means extends the pulse width of the pulse signal generated by said pulse generating means, and inverts a logical state of the extended pulse signal with respect to the pulse signal generated by said pulse generating means.

* * * * *